United States Patent [19]

Saxe

[11] Patent Number: 5,526,301
[45] Date of Patent: Jun. 11, 1996

[54] HIGH-SPEED ANALOG ACQUISITION INCLUDING SIGNAL PROCESSING

[75] Inventor: Charles L. Saxe, Portland, Oreg.

[73] Assignee: Tektronix, Inc., Wilsonville, Oreg.

[21] Appl. No.: 372,627

[22] Filed: Jan. 13, 1995

[51] Int. Cl.[6] ................................................. G11C 27/04
[52] U.S. Cl. .......................... 365/45; 365/219; 365/239; 365/240
[58] Field of Search .................................. 365/236, 219, 365/239, 240, 221, 45

[56] References Cited

U.S. PATENT DOCUMENTS

| | | | |
|---|---|---|---|
| 4,156,286 | 5/1979 | Connors et al. | 365/45 |
| 4,257,111 | 5/1981 | Soohoo et al. | 365/114 |
| 4,271,488 | 6/1981 | Saxe | 365/230 |
| 5,144,525 | 9/1992 | Saxe | 365/45 |

*Primary Examiner*—David C. Nelms
*Assistant Examiner*—Son Dinh
*Attorney, Agent, or Firm*—Brent F. Logan; Boulden G. Griffith

[57] ABSTRACT

A high-speed data acquisition and processing system. The system includes a sequential sampler that samples an input signal at periodic intervals. The resulting samples are provided on a plurality of sample outputs. These sample outputs are received by a matrix of signal processors, each of which receives and processes at least two inputs, and provides a processor output. The first row of signal processors receives the sample outputs and processes them. Subsequent rows of signal processors receive and process the outputs of signal processors in previous rows.

23 Claims, 8 Drawing Sheets

HIGH-SPEED ANALOG ACQUISITION INCLUDING SIGNAL PROCESSING

FIELD OF THE INVENTION

The present invention pertains to the field of high-speed analog data acquisition and signal processing.

BACKGROUND OF THE INVENTION

There exist fast-in-slow-out (FISO) analog memories for acquiring analog data and a very rapid rate and then reading out the data at a much slower rate. One example of such a FISO analog memory is described in Saxe, U.S. Pat. No. 4,271,488. Another example is described in Saxe, U.S. Pat. No. 4,144,525.

Such FISO analog memories are limited in the amount of data they can contain. Once the memory is filled, acquisition must stop while the memories are read and the data are processed.

Therefore, existing FISO analog memories allow data to be acquired at varying sample rates or "decimation" rates. At a slower sample rate, that is, a higher decimation rate, less data is acquired per unit of time. While this can increase the time record available, it also decreases the effective bandwidth of the data, and therefore increases the possibility of aliasing.

SUMMARY OF THE INVENTION

A high-speed data acquisition and processing system according to the present invention includes a sequential sampler that samples an input signal at periodic intervals. The resulting samples are provided on a plurality of sample outputs.

These sample outputs are received by a matrix of signal processors, each of which receives and processes at least two inputs, and provides a processor output. The first row of signal processors receives the sample outputs and processes them.

As a feature of the present invention, subsequent rows of signal processors receive and process the outputs of signal processors in previous rows.

Each signal processor can detect which of its input signals is larger and provide that signal as its output signal. Alternatively, each signal processor can sum its input signals and provide the sum as its output signal.

A plurality of multipliers can be interposed between the sequential sampler and the matrix of signal processors. The multiplication factors can be individually varied to allow summing signal processors to do signal averaging and finite impulse response filtering.

As a feature of the present invention, all incoming data at the maximum sampling rate is used to form the output. This feature provides the advantage of decreasing the likelihood of aliasing. Furthermore, the invention can detect peaks, signal "glitches" and other waveform anomalies down to the smallest sample interval independent of the decimation rate chosen.

These and other features and advantages of the present invention will be made more clear when considering the following specification when taken in conjunction with the appended drawings.

DETAILED DESCRIPTION OF THE INVENTION

Figure 1:
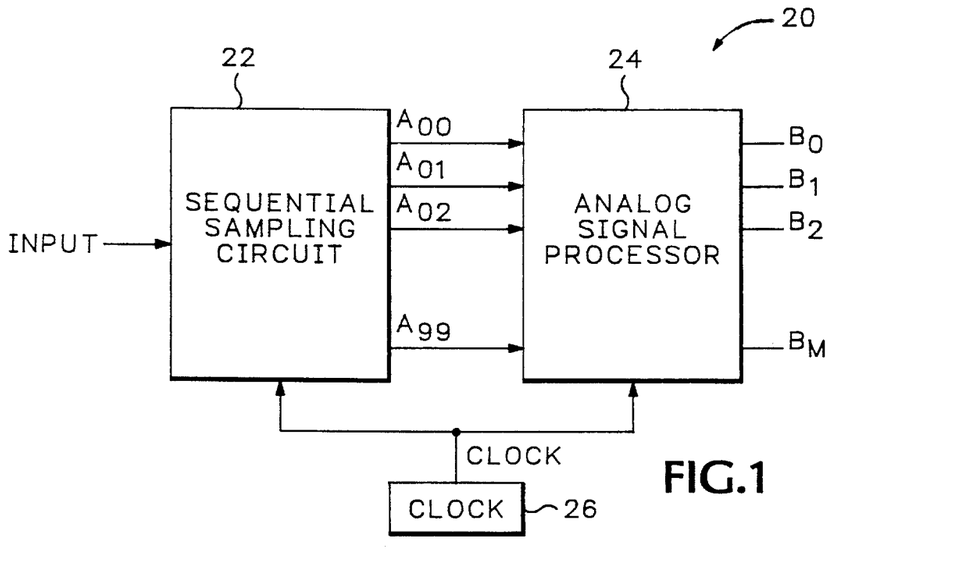
FIG. 1 is a block diagram of a high speed analog data acquisition system according to the present invention.

Referring to the drawings, and first to FIG. 1, a high-speed data acquisition system 20 comprises a sequential sampling circuit 22, an analog signal processor 24, and a clock 26. The clock 26 provides a periodic clock signal CLOCK to the sequential sampling circuit and the analog signal processor.

The high-speed data acquisition system 20 receives an analog input signal INPUT, samples it at regular intervals, and provides the resulting sample signals $A_{00}$-$A_{99}$ in sequence on 100 respective analog outputs. The sample signal $A_{i+1}$ corresponds to the analog input signal INPUT one sampling interval after the sample on analog output $A_i$. Furthermore, sample $A_{00}$ corresponds to the analog input signal one interval after the sample on analog output $A_{99}$. The sequential sampling circuit 22 is described in more detail below.

The analog signal processor 24 receives the 100 samples signals $A_{00}$-$A_{99}$ and performs analog signal processing on them. Peak detection, signal averaging, and finite impulse response (FIR) filtering all are examples of the types of signal processing that the analog signal processor 24 can perform. The analog signal processor places the m resulting signals $B_0$-$B_{m-1}$ on m respective processor outputs. Two implementations of an analog signal processor are discussed below with respect to FIGS. 8 and 9.

The clock 26 provides a regular, periodic signal to the sequential sampling circuit 22 and the analog signal processor 24. The period T of the clock determines the sampling interval of the sequential sampling circuit 22. In the exemplary embodiment described, the clock signal has a frequency of 200 MHz; thus, period T is 5 ns.

Figure 2A:
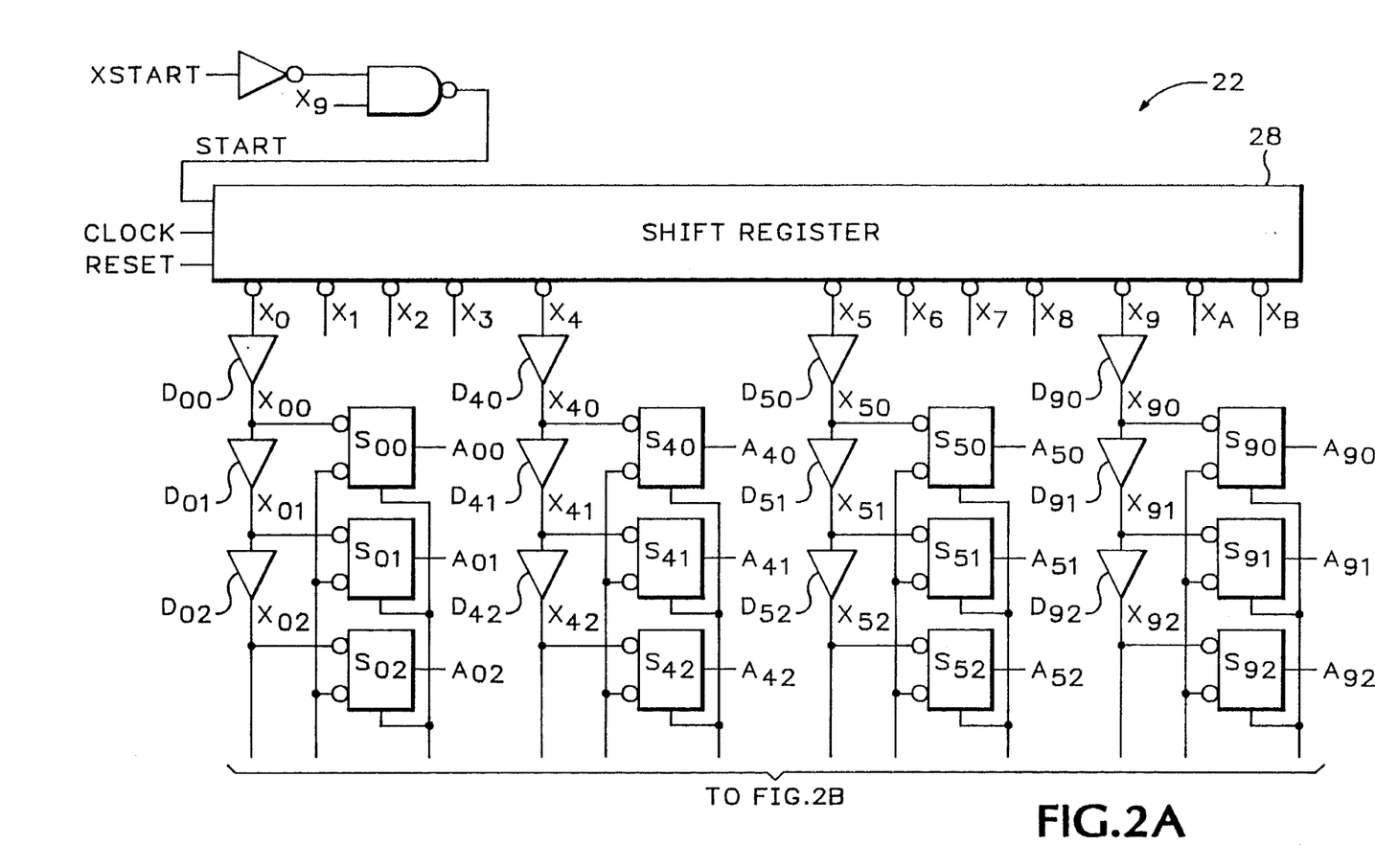
FIG. 2 is a partial block diagram of the sequential sampling circuit shown in FIG. 1.
Figure 2B:
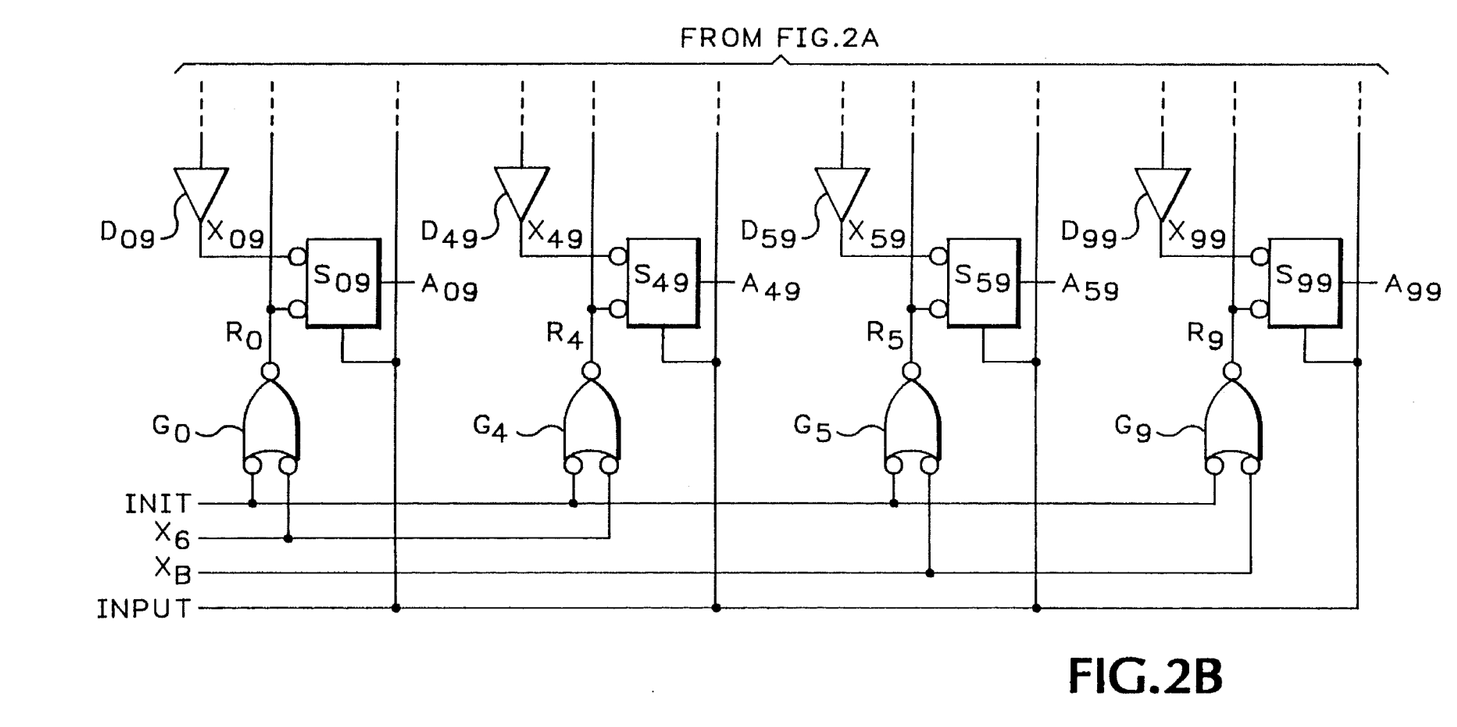

Referring now to FIG. 2, the sequential sampling circuit 22 includes 100 set-reset track-and-hold circuits (SRTH circuits) $S_{00}$-$S_{99}$ arranged in a rectangular matrix of ten rows and ten columns. These SRTH circuits are controlled by a 12-bit recirculating shift register 28 having 12 active-low output signals $X_0$-$X_B$ and by 100 delay circuits $D_{00}$-$D_{99}$.

Figure 3:
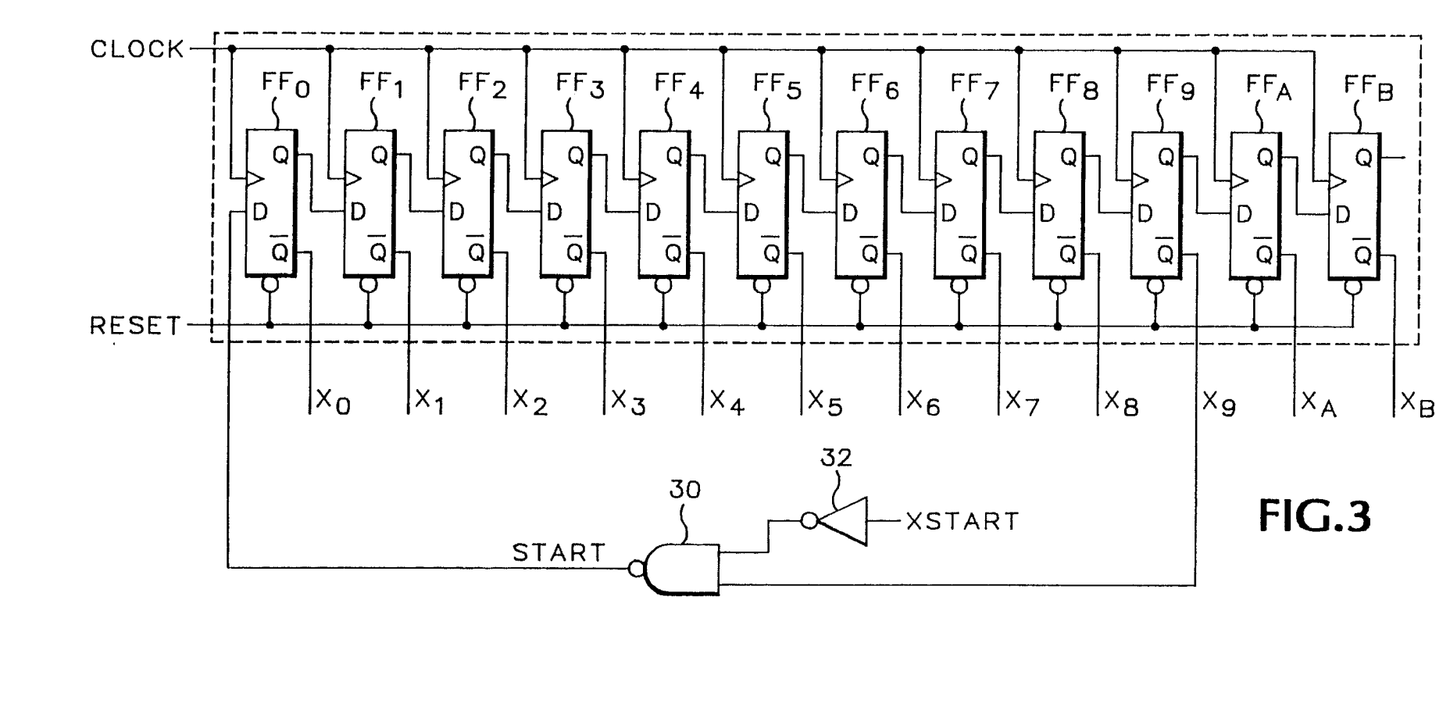
FIG. 3 is a block diagram of the shift register shown in FIG. 2.

Referring now to FIG. 3, the shift register 28 includes 12 "type D" flip-flops $FF_0$-$FF_B$ arranged in series such that the Q output of one flip-flop is connected to the D input of the next flip-flop. Each flip-flop also receives the clock signal CLOCK and a RESET signal. The D input of the first flip-flop $X_0$ receives the inverted output $\overline{Q}$ of the tenth flip-flop $X_9$ via a NAND gate 30. An initialization signal XSTART also is connected to the NAND gate 30 via an inverter 32.

When the RESET signal goes "low," the Q outputs of all the flip-flops are reset "low." Then the initialization signal XSTART is pulsed "high," causing signal START to also go "high" for a single clock cycle. The rising edge of the clock signal CLOCK clocks this "high" into the Q output of the first flip-flop $FF_0$. The inverting output $\overline{Q}$ thus goes "low."

The "high" propagates through the shift register 28 until it reaches the tenth flip-flop $FF_9$, where it then recirculates back to the D input of the first flip-flop $FF_0$. The eleventh and twelfth flip-flops $FF_A$ and $FF_B$ receive in turn the output from the tenth flip-flop. Thus, the shift register has ten unique states in which a "high" logic level recirculates through the individual flip-flops.

The output signals $X_0$-$X_B$ originate at the inverting outputs $\overline{Q}$ of the flip-flops $FF_0$-$FF_b$. Thus, as seen by the rest of the sequential sampling circuit 22, a "low" logic level cycles through the shift register 28.

It will be recognized by one of ordinary skill in the relevant art that a different arrangement of components could be used to make the shift register 28, where the signals $X_0$-$X_B$ provided to the sequential sampling circuit 22 are the same signals that cycle through the shift register. This would be functionally equivalent to the circuit shown in FIG. 3.

Figure 4:
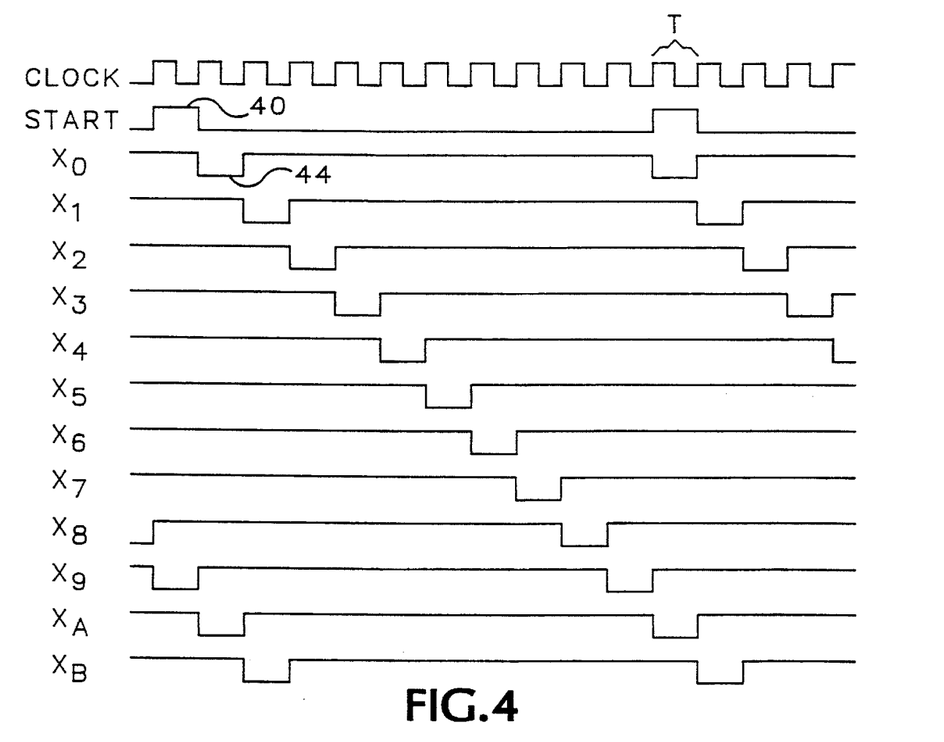
FIG. 4 is a signal diagram of selected signals associated with the shift register shown in FIGS. 2–3.

Referring now to FIG. 4, selected signals of the shift register 28 are shown. The CLOCK signal has a frequency of 200 MHz; thus it has a period T of 5 ns.

The START signal provides a logic "high" to the input of the first flip-flop $FF_0$ at 40. At the next rising edge 42 of the CLOCK signal, the "high" shows up at the Q output of the first flip flop $FF_0$, and is reflected by a "low" pulse 44 at the inverting $\overline{Q}$ output as shown at 42 on signal $X_0$. This "low" propagates through the flip-flops with each rising edge of the CLOCK signal until it reaches $X_9$, at which point it is returned back to the first flip-flop. Thus, each of the outputs $X_0$-$X_B$ of the shift register 28 is "high" for 45 ns and then goes "low" for 5 ns.

After the "low" has recirculated through the outputs $X_0$-$X_9$ shift register 28 once, the output signals $X_A$ and $X_B$ of the eleventh and twelfth flip-flops $FF_A$ and $FF_B$, respectively, duplicate the output signals $X_1$ and $X_2$ of the first and second flip-flops $FF_0$ and $FF_1$.

Referring again to FIG. 2, each delay circuit $D_{00}$-$D_{99}$ has a 0.5 ns delay. The delay circuits are arranged in series with ten chains having ten delay circuits each. Each chain of delay circuits receives a respective output signal $X_0$-$X_9$ from the shift register 28. Only the first, fifth, sixth, and tenth chains of delay circuits are shown in FIG. 2. The chains of delay circuits function as tapped delay lines and progressively delay the shift register output signals $X_0$-$X_9$, resulting in delayed "capture" signals $X_{00}$-$X_{99}$ which are provided as a control signal to the SRTH circuits $S_{00}$-$S_{99}$. For meaningful signal processing, these delay circuits must be calibrated to provide consistent results. Preferably, the delay circuits have hardware calibration to adjust their delays to precisely 0.5 ns.

Another embodiment of a sequential sampling system is disclosed in Saxe et al., U.S. Pat. No. 5,144,525, where is hereby incorporated by reference.

Each of the first through fifth columns of the SRTH circuits $S_{00}$-$S_{49}$ has a respective AND gate $G_0$-$G_4$ that receives the $X_6$ output from the shift register 28 and an initialization signal INIT, resulting in respective "release" signals $R_0$-$R_4$. Only the first and fifth AND gates $G_0$ and $G_4$ are shown in FIG. 2. The release signals $R_0$-$R_4$ are provided as another control input to their respective columns of SRTH circuits $S_{00}$-$S_{49}$.

Similarly, each of the sixth through tenth columns of the SRTH circuit $S_{50}$-$S_{99}$ has a respective AND gate $G_5$-$G_9$ that receives the $X_B$ output from the shift register 28 and the initialization signal INIT, resulting in respective release signals $R_5$-$R_9$. Only the sixth and tenth AND gates $G_5$ and $G_9$ are shown in FIG. 2. The release signals $R_5$-$R_9$ are provided as another control input to their respective columns of SRTH circuits $S_{50}$-$S_{99}$.

Each SRTH circuit $S_{00}$-$S_{99}$ receives the analog input signal INPUT.

Figure 5:
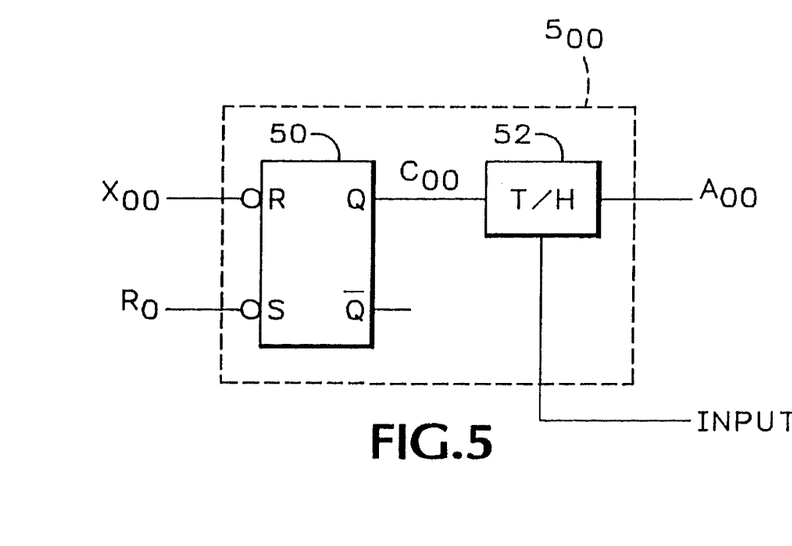
FIG. 5 is a block diagram of one of the set-reset track-and-hold shown in FIG. 2.

Referring now to FIG. 5, the first SRTH circuit $S_{00}$ comprises two circuit elements: an S-R flip-flop 50 and a track-and-hold (T/H) circuit 52.

The S-R flip-flop 50 can be composed from two cross-coupled NOR gates, a well-known type of S-R flip-flop. The R input of the S-R flip-flop receives the capture signal $X_{00}$. The S input receives the release signal $R_0$. The resulting signal $C_{00}$ on the Q output is provided as a control signal $C_{00}$ to the track-and-hold circuit 52. The inverting output $\overline{Q}$ is unused.

The track-and-hold circuit 52 receives the control signal $C_{00}$ and the analog input signal INPUT. When the control signal is "high," an internal analog value within the track-and-hold circuit 52 tracks the analog input signal INPUT. When the control signal $C_{00}$ goes "low," the internal analog value transfers to the output signal $A_{00}$. The output signal $A_{00}$ then remains constant until another internal analog value is transferred to it the next time the control signal $C_{00}$ goes low.

Each of the 100 SRTH circuits $S_{00}$-$S_{99}$ is identical to the SRTH circuit shown in FIG. 5. Each SRTH circuit receives the analog input signal INPUT. Each also receives a respective capture signal $X_{ij}$ and a respective release signal $R_i$, where i and j represent the column and row, respectively, of the SRTH circuits.

Figure 6:
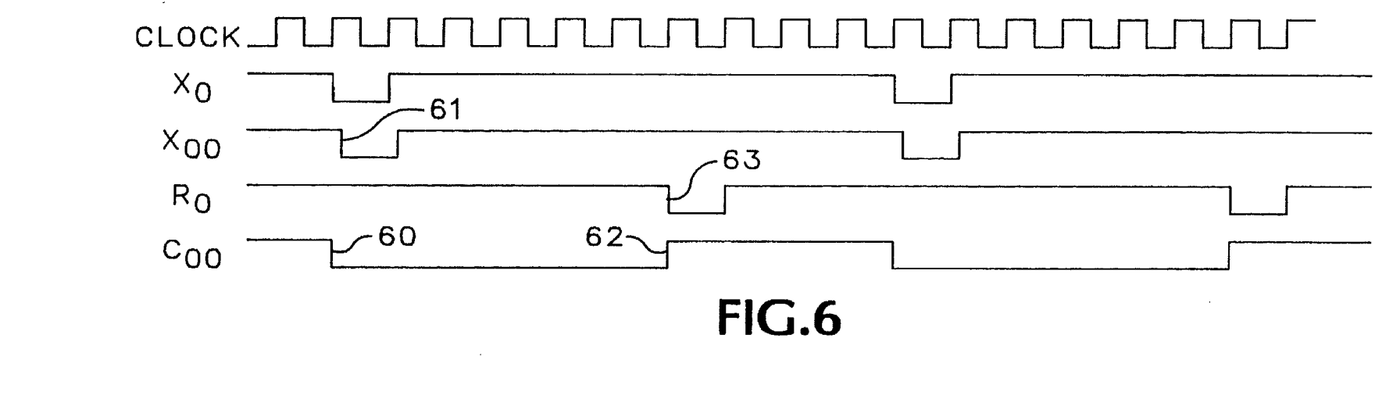
FIG. 6 is a signal diagram of selected signals associated with the set-reset track-and-hold shown in FIG. 5.

Referring now to FIG. 6, selected signals in the sequential sampling circuit 22 and specifically the first SRTH circuit $S_{00}$ are shown. The clock signal CLOCK is shown to provide a reference for the relative timings. Signal $X_0$ from the shift register 28 is delayed 0.5 ns by the delay circuit $D_{00}$, resulting in the capture signal $X_{00}$. The initialization signal INIT is normally "high," thus the release signal $R_0$ corresponds to signal $X_6$ from the shift register 28. Control signal $C_{00}$ becomes "low" at 60 in response to the capture signal $X_{00}$ going "low" 61 and returns "high" at 62 in response to the release signal $R_0$ going "low" 63. Thus, the track-and-hold circuit 52 (FIG. 5) holds its output $A_{00}$ constant in response to the capture signal $X_{00}$ going "low."

Figure 7:
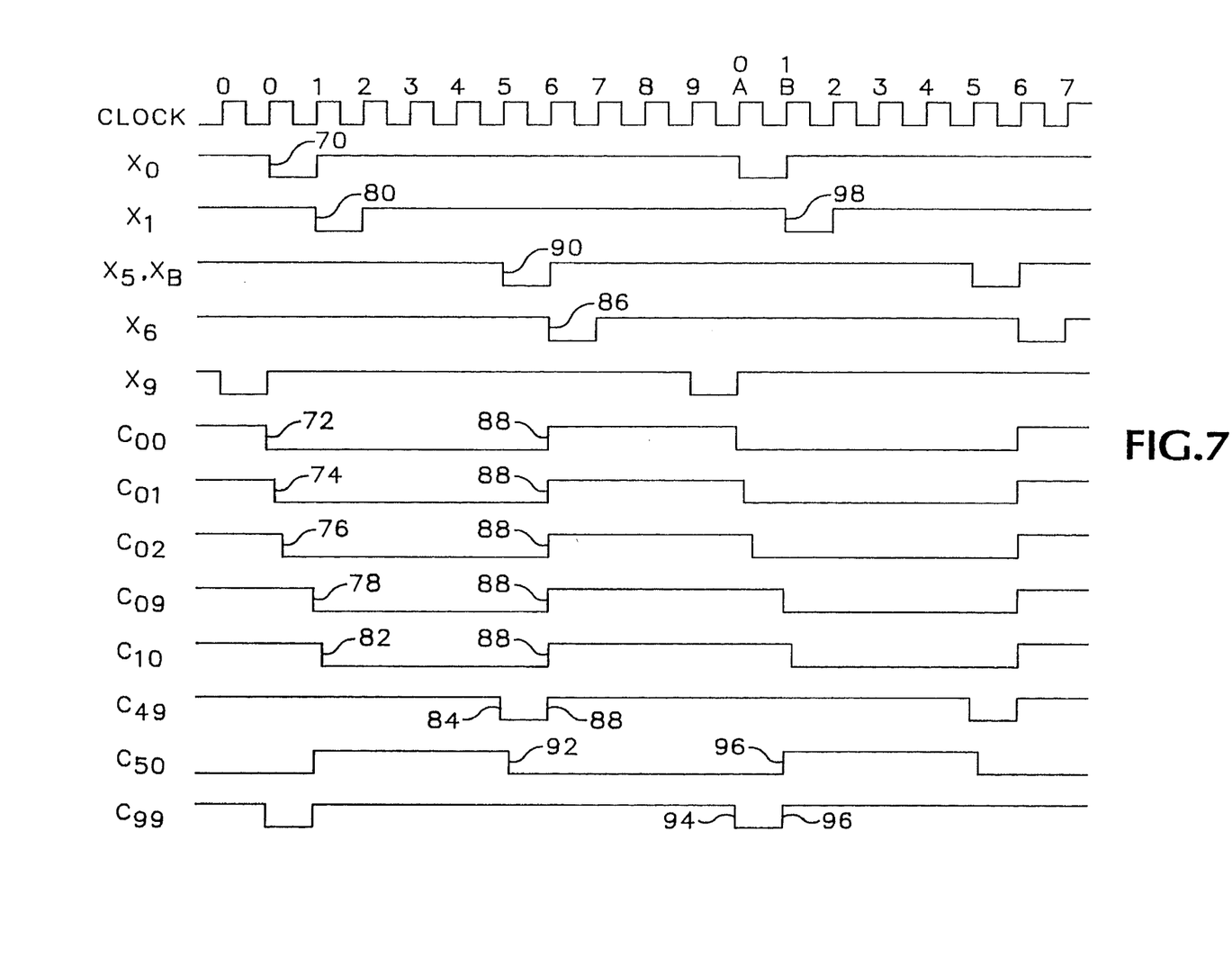
FIG. 7 is a signal diagram of selected signals associated with the sequential sampling circuit shown in FIG. 1.

Referring now to FIGS. 2 and 7, the clock signal CLOCK, selected outputs $X_i$ of the shift register 28, and selected SRTH control signals $C_{ij}$ are shown. The first output signal $X_0$ of the shift register 28 transitions from "high" to "low" at 70. This transition propagates down the first column of delay circuits $D_{01}$-$D_{09}$, resulting in the first column's capture signals $X_{00}$-$X_{09}$ going "low" in sequence. In response, the control signals $C_{00}$-$C_{09}$ within the SRTH circuits $S_{00}$-$S_{09}$ also go "low." This is seen by the first control signal $C_{00}$ going "low" at 72 after $X_0$ goes "low." Likewise, the second and third control signals $C_{01}$ and $C_{02}$ go "low" in sequence at 74 and 76. The time interval between successive control signals transitioning "low" is equal to the delay time of the delay circuits $D_{ij}$, or 0.5 ns.

The tenth control signal $C_{09}$ goes "low" at 78, 5 ns after the first shift register output signal $X_0$ went "low" at 70. However, this is the same time that the second shift register output signal $X_1$ goes "low" at 80. Control signal $C_{10}$ goes "low" 0.5 ns later at 82.

The remaining control signals $C_{11}$-$C_{49}$ in the first five columns of SRTH circuits $S_{11}$-$S_{49}$ transition to "low" in sequence, with the transition of $C_{49}$ shown at 84.

As seen on FIG. 2, the first five columns of SRTH circuits $S_{00}$-$C_{49}$ receive identical release signals $R_0$-$R_4$ resulting from a logical "OR" combination of the active-low initialization signal INIT and the seventh output signal $X_6$ of the shift register 28. Thus, the control signals $C_{00}$-$C_{49}$ in the first five columns of SRTH circuits all go "high" at the same time 88, corresponding to the time signal $X_6$ goes "low" at 86.

The last five columns of SRTH circuits $S_{50}$-$S_{99}$ operate similarly to the first five columns of SRTH circuits $S_{00}$-$S_{49}$, described above. Their respective control signals $C_{50}$-$C_{99}$ transition "low" in sequence, with the transitions 92, 94 of control signals $C_{50}$ and $C_{99}$ shown in FIG. 7.

The last five columns of SRTH circuits $S_{50}$-$S_{99}$ receive identical release signals $R_5$-$R_9$ resulting from a logical "OR" combination of the active-low initialization signal INIT and the twelfth output signal $X_B$ of the shift register 28. Thus, the control signals $C_{50}$-$C_{99}$ for the last five columns of SRTH circuits all go "high" at the same time 96, corresponding to the time signal $X_B$ goes "low" at 98.

As described above, the sequential sampling circuit. 22 samples the input signal INPUT at 0.5 ns intervals and provides the resulting samples in sequential order on the SRTH outputs $A_{00}$-$A_{99}$. The first five columns of SRTH outputs $A_{00}$-$A_{49}$ are valid from the time they are sampled until the time their respective control signals $C_{00}$-$C_{49}$ go "high" at 88. Likewise the second five columns of SRTH outputs $A_{50}$-$A_{99}$ are valid from the time they are sampled until the time their respective control signals $C_{50}$-$C_{99}$ go "high" at 96.

Figure 8:
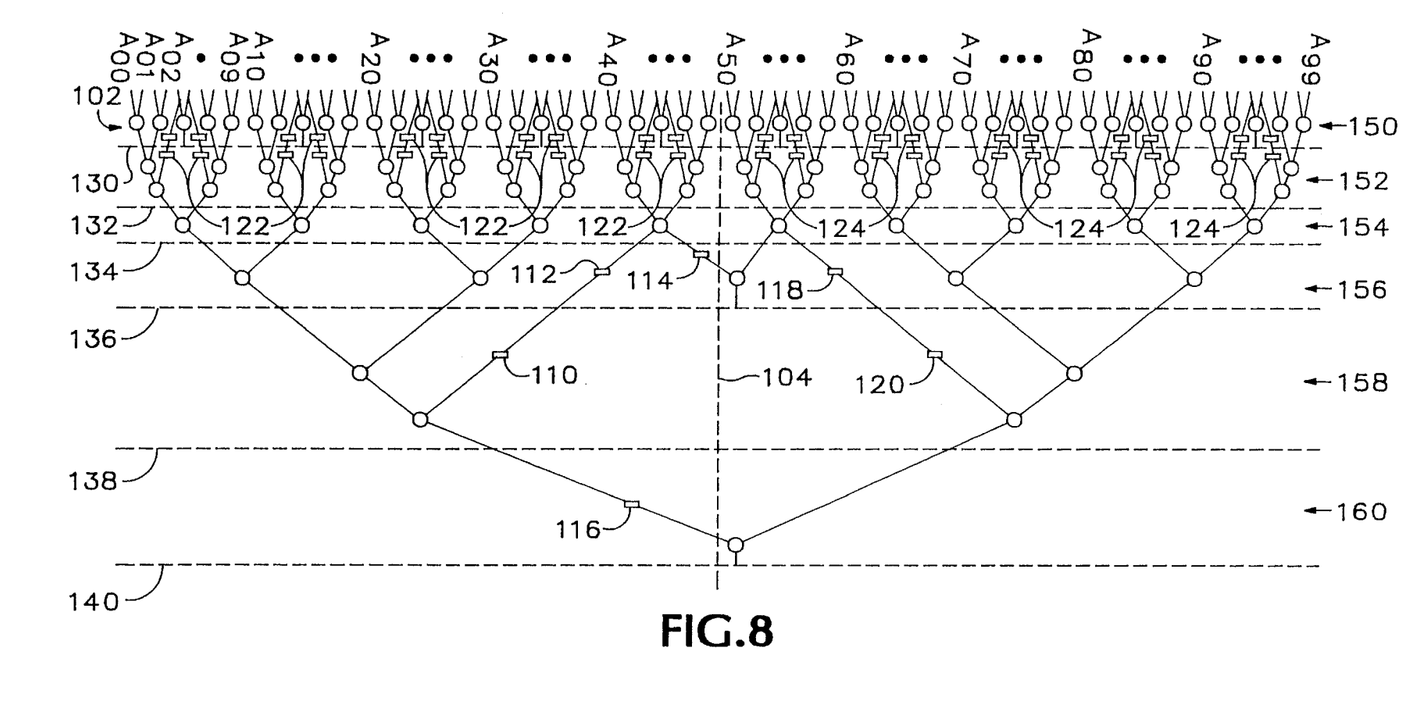
FIG. 8 is a block diagram of a first analog signal processor shown in FIG. 1.

Referring now to FIG. 8, the analog signal processor 24 includes 110 peak-detecting track-and-hold (PDTH) circuits, which are represented by circles in the drawing. These PDTH elements are arranged in an array and act as a parallel, pipelined processor.

The analog signal processor 24 is capable of decimating the input signals by 2, 5, 10, 20, 50, and 100. At each decimation range, the output of the analog signal processor 24 is the peak of all the input signals within the range. For example, when decimating by 10, ten 0.5 ns samples are processed to find the peak signal over the 5 ns period.

The analog signal processor 24 is divided into six horizontal regions 150-160, with each region corresponding to one of the decimation ranges. The signals crossing the horizontal lines 130-140 between the decimation ranges carry the decimated data. Thus, the intersections of the signal lines and the horizontal lines represent the outputs $B_0$-$B_m$ of the analog signal processor shown in FIG. 1.

The decimated data from one region are received by the next region. Thus, the decimated data from the decimate-by-2 region 150 are received the decimate-by-5 region 152. Likewise, the decimated data from the decimate-by-5 region 152 are received by the decimate-by-10 region 154.

Each region of PDTH circuits acts as an analog pipeline stage so that once the pipeline is filled, data will flow out of each decimation output each time the pipeline is clocked. Thus, the analog signal processor 24 produces all of the decimated output rates simultaneously.

Each PDTH circuit receives two analog inputs and a clocking control signal. When the controlling signal is "low," an internal analog store tracks the greater of its two analog inputs. When the controlling signal transitions to "high," the value of the internal analog store is transferred to the output of the PDTH circuit, which holds the value.

As shown in FIG. 8, the 50 PDTH circuits in the decimate-by-two region 150 receive the 100 SRTH outputs $A_{00}$-$A_{99}$ from the 100 SRTH circuits $S_{00}$-$S_{99}$. The control signal $C_{00}$ for the first SRTH circuit $S_{00}$ also serves as the clocking control signal for the PDTH circuits on the left side of dashed line 104. The control signal $C_{50}$ for the first SRTH circuit $S_{50}$ in the sixth column also serves as the clocking control signal for the PDTH circuits on the right side of the dashed line 104.

Also shown in FIG. 8 are 46 analog master-slave storage elements 110-122. Each storage element receives an analog input signal and a control signal. The input signal is transferred to the master while the control signal is "low." The signal on the master is transferred to the output when the control signal transitions to a "high."

Storage elements 110, 112, 118, and 120 act as a one-cycle delay, keeping the data that is moving between the decimate-by-10 region 154 and the decimate-by-50 region 158 synchronized. Thus, the storage elements 110, 112 on the left side of the dashed line 104 use control signal $C_{00}$ as their control signal. Likewise, the storage elements 118, 120 on the right side of the dashed line 104 use control signal $C_{50}$ for their control signal.

Likewise, storage elements 122, 124 keep the data that is moving between selected SRTH outputs $A_{04}$, $A_{05}$, $A_{14}$, $A_{15}$, $A_{24}$, $A_{25}$ . . . and selected PDTH circuits in the decimate-by-5 region 152 synchronized. Storage elements 122 on the left side of the dashed line 104 use control signal $C_{00}$ for their control signal. Likewise, the storage elements 124 on the right side of the dashed line 104 use control signal $C_{50}$ for their control signal.

Storage elements 114 and 116 are used to synchronize data crossing the dashed line 104. Since their outputs are read by PDTH circuits on the right side of the dashed line 104, they use control signal $C_{50}$ as their control signal.

Once the analog signal processor 24 has been clocked for a number of cycles, decimated, peak-detected data emerges from each region 150-160 of the pipeline. Data continues to flow from each of the regions as long as the clock continues. If so desired, this data can be stored in an analog memory arrays as is done in other fast-in-slow-out devices. Since all of the decimated data streams are available the entire time the analog signal processor is clocked, a simple multiplexor can be used to direct the desired sample streams into the proper columns of an analog storage array configured as a circular buffer (not shown). Row counters could be used to determine when to stop acquiring data. The acquired data could then be read out and used as desired. Alternatively, the data could be stored in a circular buffer (not shown) and an external trigger could control the end of data acquisition.

Figure 9:
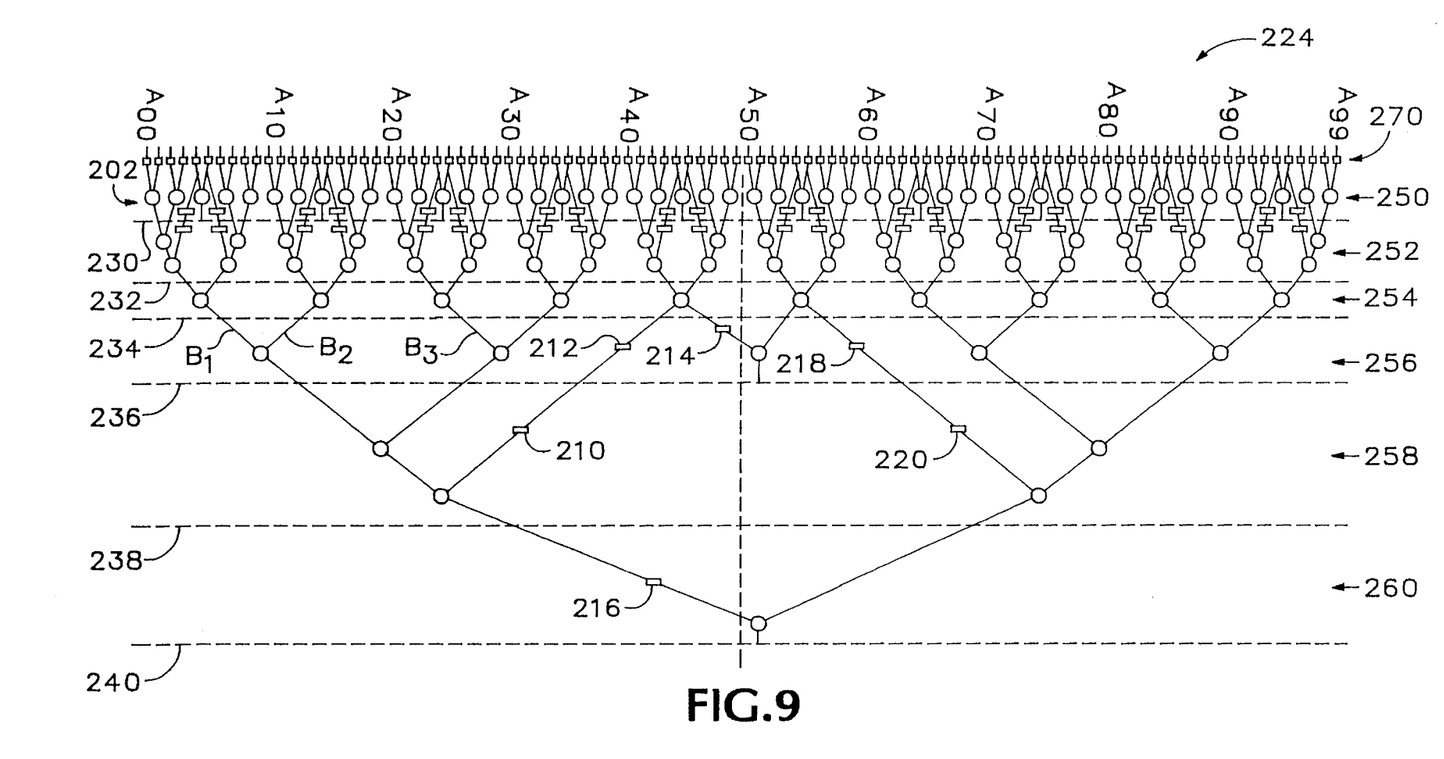
FIG. 9 is a block diagram of a second analog signal processor shown in FIG. 1.

Referring now to FIG. 9, the architecture described above for an analog signal processor 24 with respect to peak detection and decimation in FIG. 8 can be slightly modified to perform block averaging or finite impulse response (FIR) filtering with decimation. Such an analog signal processor 224 has 100 circuit elements divided into six regions 250-260 and interconnected in the same manner as described above. In this case, the circles represent clocked analog adder circuits. The adder circuits accept two analog signals and a clock signal. When the clock signal goes "low," the sum of the two analog inputs is stored in an internal master. When the clock signal goes "high," the content of the master is placed on the output.

This embodiment of an analog signal processor 224 requires 100 analog multipliers 270, one for each output $A_{00}$-$A_{99}$ of the sequential sampling circuit 22. The multipliers 270 multiply the sampling circuit's outputs before providing them to the first region 250 of adder circuits.

To perform decimation by n with block averaging, adjacent groups of n sample signals are added together and divided by n. Thus, $$B_i = c \cdot A[5i] + c \cdot A[5i+1] + c \cdot A[5i+2] + \ldots + c \cdot A[5i+(n-1)]$$

where c is the reciprocal of n, and A[i] is the ith sample signal of the sample signals $A_{00}$-$A_{99}$. Each of the multipliers 270 multiply the sample signals by c. The outputs $B_i$ emerge from the divide-by-n region of the analog signal processor 224.

For example, if n is 10, then c is 0.1, and there are 10 outputs $B_0$-$B_9$ of the analog signal processor 224. Each of the analog multipliers 270 multiplies the sample signals $A_{00}$-$A_{99}$ by 0.1. The outputs $B_0$-$B_9$ of the analog signal processor are those signals emerging from the decimate-by-10 region 254, that is, those signals that cross horizontal line 234.

To perform decimation by n with FIR filtering, the multipliers 270 multiply the sample signals $A_{00}$-$A_{99}$ by FIR filter coefficients. Thus, $$B_i = c[0] \cdot A[5i] + c[1] \cdot A[5i+1] + c[2] \cdot A[5i+2] + \ldots + c[n-1] \cdot A[5i+(n-1)]$$

where c[k] is the kth FIR filter coefficient for an nth-order FIR filter, and A[i] is the ith sample signal of the sample signals $A_{00}$-$A_{99}$. Each of the multipliers 270 multiply their respective sample signals by their respective FIR coefficient. The outputs $B_i$ emerge from the divide-by-n region of the analog signal processor 224.

For example, if n is 10, then there are ten different FIR filter coefficients c[0] through c[9]. The 10 multipliers 270 provide these multiplication factors to the sample signals $A_{00}$-$A_{99}$ in groups of ten. Thus, the first output $B_0$ is determined according to:

$$\begin{aligned}B_0 = \ & c[0] \cdot A_{00} + c[1] \cdot A_{01} + c[2] \cdot A_{02} + c[3] \cdot A_{03} + \\ & c[4] \cdot A_{04} + c[5] \cdot A_{05} + c[6] \cdot A_{06} + c[7] \cdot A_{07} + \\ & c[8] \cdot A_{08} + c[9] \cdot A_{09}\end{aligned}$$

Output B1 is formed by the same FIR coefficients applied to the next ten sample signals $A_{10}$-$A_{19}$. The ten outputs $B_0$-$B_9$ emerge from the divide-by-10 region 254, crossing horizontal line 234.

The signal processors of FIGS. 8 and 9 need not be mutually exclusive. In a preferred embodiment, the master-slave PDTH elements of FIG. 8 would be paired with the analog adder elements of FIG. 9. The multipliers 270 would precede the first region 250 of elements. Depending on the type of signal processing the user desired, one or the other type of signal processor would be switched in to the matrix. The multipliers 270 could be set to multiply by one if they are not needed.

To obtain meaningful results, the analog elements in the high-speed data acquisition and processing system must include means to compensate for errors. These errors could include gain, offset, linearity, and other errors. Techniques and circuits for providing these corrections is well known in the art. Often, differential circuits, as opposed to single-ended circuits are used.

The embodiment described above uses a slow shift-register 28 and fast delay circuits $D_{00}$-$D_{99}$ to time the acquisition of the input signal INPUT. Other methods have been used in FISOs and could be used to advantage in the present invention.

The terms and expressions which have been employed in the foregoing specification are used therein as terms of description and not of limitation, and there is no intention, in the use of such terms and expressions, of excluding equivalents of the features shown and described or portions thereof, it being recognized the scope of the invention is defined and limited only by the claims which follow.

What is claimed is:

1. A high-speed data acquisition system for acquiring an input analog signal and performing signal processing on the signal, comprising:

(a) a sequential sampler receiving the input analog signal and sampling the input analog signal at periodic intervals resulting in a sequence of samples; and (b) a plurality of first signal processors, each of said first signal processors receiving and processing at least two of said samples from said sequential sampler, and each of said first signal processors providing a respective first processor output.

2. The high-speed data acquisition system of claim 1, further comprising a second signal processor, said second signal processor receiving and processing at least two of said first processor outputs and providing in response a second processor output.

3. The high-speed data acquisition system of claim 2, wherein at least one of said first processor outputs and said second processor output are available simultaneously as outputs of said high-speed data acquisition system.

4. The high-speed data acquisition system of claim 2, wherein each of said first signal processors provides as a respective first processor output whichever is the larger of said samples received by said first signal processors.

5. The high-speed data acquisition system of claim 4, wherein said second signal processor provides as a second processor output whichever is the larger of said first processor outputs received by said second processor.

6. The high-speed data acquisition system of claim 1, wherein each of said first signal processors provides as a respective first processor output whichever is the larger of said samples received by said first signal processors.

7. The high-speed data acquisition system of claim 1, further comprising a plurality of multipliers receiving said samples from said sequential sampler and providing resulting multiplied signals to said first signal processors.

8. The high-speed data acquisition system of claim 7, further comprising a second signal processor, said second signal processor receiving and processing at least two of said first processor outputs and providing in response a second processor output.

9. The high-speed data acquisition system of claim 8, wherein each of said first signal processors provides as a respective processor output the sum of said multiplied signals received by said first signal processors.

10. The high-speed data acquisition system of claim 9, where said second signal processor provides as a second processor output the sum of said first processor outputs received by said second signal processor.

11. The high-speed data acquisition system of claim 7, wherein each of said first signal processors provides as a respective processor output the sum of said multiplied signals received by said first signal processors.

12. The high-speed data acquisition system of claim 7, wherein each of said multipliers multiplies a respective sample from said samplers by a common factor.

13. The high-speed data acquisition system of claim 1, wherein each of said first signal processors provides as a respective first processor output the sum of said multiplied signals received by said first signal processors.

14. The high-speed data acquisition system of claim 1, wherein each of said first signal processors provides as a respective processor output the sum of said multiplied signals received by said first signal processors.

15. A high-speed data acquisition system for acquiring an input analog signal and performing signal processing on the signal, said system comprising:
   (a) a sequential timer having m outputs, said sequential timer providing a plurality of respective "hold" signals in sequence on said outputs;
   (b) m samplers connected to said outputs of said sequential timer and receiving said input analog signal, each sampler sampling said input analog signal in response to receiving said "hold" signal, the samplers providing resulting respective sample signals; and
   (c) a plurality of first signal processors, each signal processor receiving at least two of said respective sample signals, said plurality of first signal processors, providing respective first signal processor output signals.

16. The high-speed data acquisition system of claim 15, further comprising a second signal processor, said second signal processor receiving and processing at least two of said first processor outputs and providing in response a second processor output.

17. The high-speed data acquisition system of claim 16, wherein at least one of said first processor outputs and said second processor output are available as outputs of said high-speed data acquisition system.

18. The high-speed data acquisition system of claim 15, wherein said sequential timer includes a shift register having a plurality of outputs connected to said samplers.

19. The high-speed data acquisition system of claim 18, wherein said sequential timer includes a plurality of delay circuits connected between said outputs of said shift register and said samplers.

20. The high-speed data acquisition system of claim 15, further comprising m multipliers interposed between said samplers and said first signal processors, each of said multipliers providing a respective multiplied signal to one of said first signal processors.

21. The high-speed data acquisition system of claim 20, wherein each of said signal processors sums said respective sample signals received by said signal processor.

22. The high-speed data acquisition system of claim 15, wherein each of said signal processors sums said respective sample signals received by said signal processor.

23. The high-speed data acquisition system of claim 15, wherein each of said signal processors detects a peak of said respective sample signals received by said signal processor.

* * * * *